United States Patent
Rosencher et al.

[11] Patent Number: 5,969,375
[45] Date of Patent: Oct. 19, 1999

[54] INFRARED DETECTOR WITH NON-COOLED QUANTUM WELL STRUCTURE

[75] Inventors: Emmanuel Rosencher, Bagneux; Borge Vinter, Paris; Vincent Berger, Paris; Daniel Kaplan, Paris; François Micheron, Gif sur Yvette, all of France

[73] Assignee: Thomson-CSF, Paris, France

[21] Appl. No.: 08/991,301

[22] Filed: Dec. 16, 1997

[30] Foreign Application Priority Data

Dec. 20, 1996 [FR] France ................... 96 15738

[51] Int. Cl.$^6$ .............................. H01L 31/0328
[52] U.S. Cl. ................. 257/21; 257/184; 257/188; 257/189; 257/441; 257/13; 257/14
[58] Field of Search .................. 257/21, 14, 22, 257/17, 188, 15, 200, 184

[56] References Cited

U.S. PATENT DOCUMENTS

| | | | |
|---|---|---|---|
| 4,903,101 | 2/1990 | Maserjian | 257/21 |
| 5,086,327 | 2/1992 | Rosencher et al. | |
| 5,187,715 | 2/1993 | Weisbuch et al. | |
| 5,311,009 | 5/1994 | Capasso et al. | 257/21 |
| 5,311,221 | 5/1994 | Vodjdani et al. | |
| 5,315,128 | 5/1994 | Hunt et al. | 257/16 |
| 5,352,904 | 10/1994 | Wen et al. | 257/21 |
| 5,378,289 | 1/1995 | Noguchi et al. | |
| 5,412,229 | 5/1995 | Kuhara et al. | 257/183 |
| 5,432,362 | 7/1995 | Lippens et al. | |
| 5,485,015 | 1/1996 | Choi | 257/21 |
| 5,506,418 | 4/1996 | Bois et al. | |
| 5,510,627 | 4/1996 | Snow | 257/21 |
| 5,521,397 | 5/1996 | Zhang | 257/17 |
| 5,552,603 | 9/1996 | Stokes | 257/21 |
| 5,563,423 | 10/1996 | Wu et al. | 257/21 |
| 5,646,421 | 7/1997 | Liu | 257/21 |
| 5,684,817 | 11/1997 | Houdre et al. | |
| 5,783,838 | 7/1998 | Kyozuka et al. | 257/21 |

FOREIGN PATENT DOCUMENTS

0 448 869  10/1991  European Pat. Off.

*Primary Examiner*—David B. Hardy
*Assistant Examiner*—Huy Bui
*Attorney, Agent, or Firm*—Oblon, Spivak, McClelland, Maier & Neustadt, P.C.

[57] ABSTRACT

A detector with quantum structure comprising a small-gap semiconductor material inserted between two large-gap semiconductor materials, the structure comprising a coupling grating between the wave to be detected and the detector zone constituted by the small-gap material. Under these conditions, the detector zone may have a very small thickness (typically of the order of 1,000 Å) and lead to a detectivity, limited by the dark current, that is high.

7 Claims, 7 Drawing Sheets

INFRARED DETECTOR WITH NON-COOLED QUANTUM WELL STRUCTURE

BACKGROUND OF THE INVENTION

The field of the invention is that of detectors with quantum well structure working in the infrared range, both in band II (between 3 and 5 µm) and in band III (between 8 and 12 µm).

At present, there are three types of detectors used in the infrared domain.

A first type relates to the detectors with Schottky junction formed between silicon and platinum silicon (Si/PtSi). These detectors perform well (as measured by a minimum temperature detectable commonly called NETD or noise equivalent temperature detectable of about 80 mK in band II for reading frequencies of 50 Hz, surface areas of 50 µm×50 µm and an optical aperture of f/2), but have very low working temperatures (of about 77 K).

A second type relates to bolometrical or pyrometrical thermal detectors based on the changing of electrical properties such as the dielectric index or the resistance under the effect of heating due to the radiation absorbed. These detectors lead to more modest performances (with NETD values of about 120 mK under the conditions of measurement described here above and for band III). Nevertheless, their great value is that they work at ambient temperature without needing to be cooled.

A third type of detector relates to quantum structure detectors using p-n junctions based on semiconductors such as InSb, HgCdTe or PbSnSe or intersubband transitions in quantum wells of materials such as GaAs/AlGaAs.

These detectors have very high performance characteristics (with NETD values in the neighborhood of 20 mK) but work at temperatures in the range of 200 K in the best cases.

These last-mentioned detectors which perform very well therefore require cyrogenic cooling. This represents an extra cost for the equipment.

Indeed, as described in R. J. Keyes, "Optical and Infrared Detectors", Springer-Verlag, the detectability of a component of this type is proportional to $1/\sqrt{I_{dark}}$ where $I_{dark}$ is the dark current of the detector. In semiconductor-based quantum structure detectors, the current $I_{dark}$ is thermally active, namely it varies as a function of the temperature in the form $I_{dark} \alpha e^{-Eg/jkT}$ where Eg is the width of the gap of the semiconductor, close to the energy of the photon to be detected.

More specifically, the dark current in a photovoltaic detector is given by the following equation:

$I_{dark} = I_{diff} + E_{ZCE}$ with $I_{diff} = q\, L_{diff} \cdot n_i^2 / \tau_{min} \cdot N_{dop}$ and $I_{ZCE} = q\, n_i\, d/\tau_{min}$ where:

$I_{diff}$ is the diffusion current $I_{ZCE}$ is the space charge zone current $L_{diff}$ is the diffusion length (typically some tens to some hundreds of microns)

$\tau_{min}$ is the lifetime of the minority carriers $n_i$ is the intrinsic carrier density d is the thickness of the space charge zone.

Figure 1:
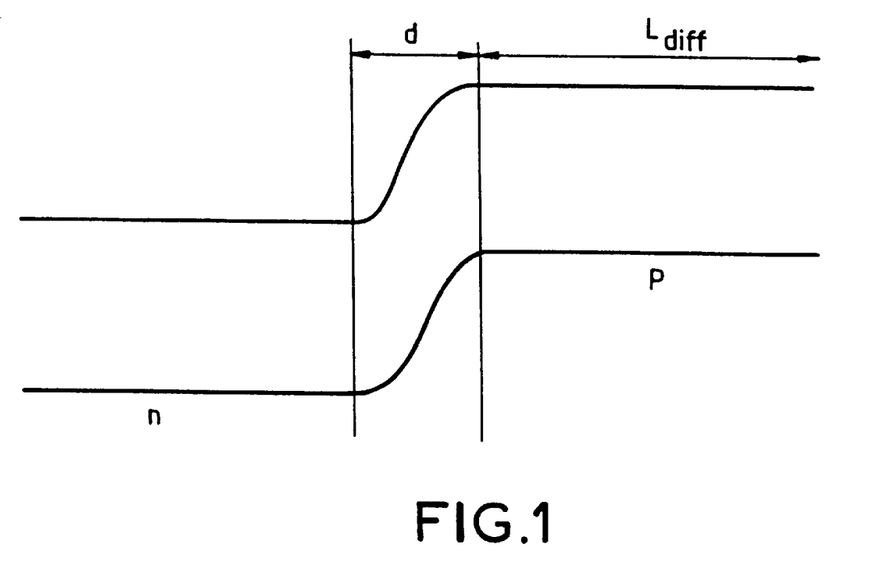
FIG. 1 gives a schematic view of the lengths of detection and diffusion in a detector according to the prior art.

FIG. 1 illustrates a standard photovoltaic detector having a p-n junction in which the lengths $L_{diff}$ and d are shown.

Figure 2:
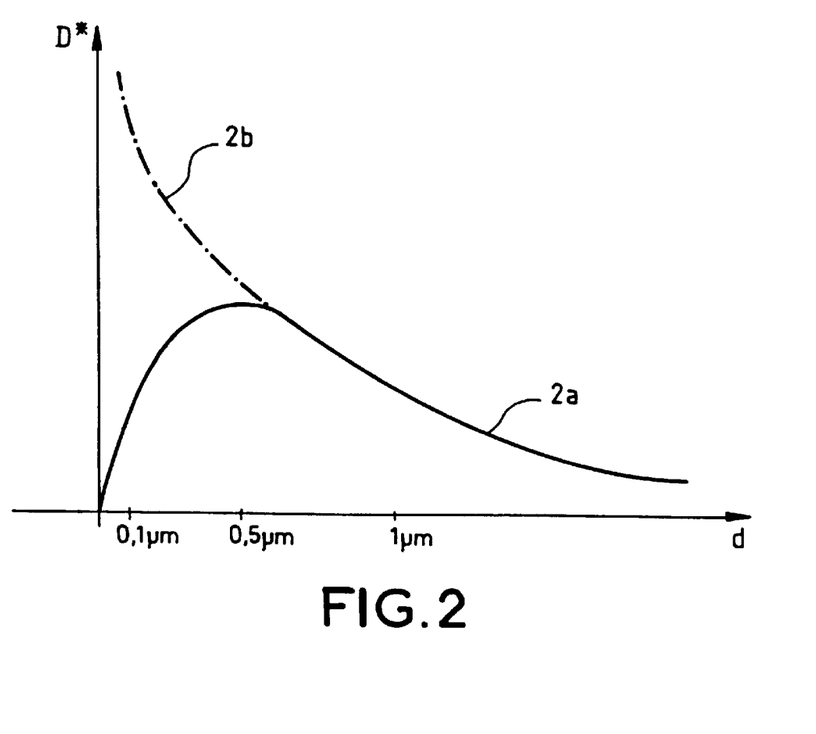
FIG. 2 illustrates changes in detectivity limited by the dark current as a function of the thickness of the detector zone in a semiconductor-based quantum detector. The curve 2a pertains to a prior art quantum detector. The curve 2b pertains to a detector according to the invention.

In these detectors, it is particularly $n_i^2$ that gives the thermally activated term. Conventionally, by cooling these infrared detectors, the dark current and therefore the associated noise are reduced. Furthermore, since the dark current is proportional to the thickness d of the detector zone, it is judicious to have a very thin detector zone. More specifically, the detectivity limited by the dark current is given by the formula:

$D^* = \eta \lambda / [u^{1/2} hc \cdot (I_{dark}/qG^2A)^{1/2}]$ where q is the charge of the electron h is Planck's constant c is the velocity of light k is the Boltzmann constant T is the temperature G is the gain in photoconduction (G=1 if the component is photovoltaic)

u=2 if the component is photovoltaic u=4 if the component is photoconductive, and η=the quantum yield given by the absorption of light in the layer with a thickness d giving:

$\alpha = 1 - e^{-\alpha d}$ where α is the coefficient of absorption of the material. The detectivity D* is therefore proportional to:

$D^* \alpha\, \eta(d)/\sqrt{d}$ and in the standard case $\eta(d) = 1 - e^{-\alpha d}$ FIG. 2 illustrates the development of the detectivity D* as a function of the thickness d. The curve 2a relates to standard quantum detectors in which $\eta(d) = 1 - e^{-\alpha d}$, these detectors typically using thicknesses in the range of one micron. The curve 2b pertains to a quantum detector in which η(d) is constant. With this type of detector, it becomes particularly useful to work with a very low thickness d which may be in the range of 0.1 µm and a constant quantum yield η, the very low thickness d leading to low dark currents that no longer require any device for the cooling of the detector.

SUMMARY OF THE INVENTION

To achieve the working conditions explained here above, the detector with a quantum-well structure that is an object of the invention is a detector comprising a stack of layers of semiconductor materials on a substrate with an electromagnetic wave detection zone, wherein the stack of layers comprises a layer of semiconductor material with low gap energy constituting the detecting zone, contained between two layers of a semiconductor material with high gap energy, and wherein the detector comprises a coupling grating on the stack of layers to obtain efficient coupling between the optical wave to be detected and the detector zone.

Advantageously, the layer of semiconductor material with a small gap has a small thickness d, typically of about 1000 Å to maintain low dark currents in the detector.

The coupling grating for its part enables an increase in the coupling between the detector zone and the electromagnetic wave so as to keep a high quantum yield η.

According to a first variant of the invention, the quantum detector is a photoconductor detector comprising electrical means to measure the variations of resistivity due to the input of electrons into the conduction band of the small-gap material, during the detection of the optical wave. The region constituted by semiconductor materials with a small gap having a small thickness d is in this case inserted between two layers constituted by large-gap semiconductor materials SGG1 and SGG2 that are not doped and are therefore ideally insulating at ambient temperature. A diffracting grating may advantageously be etched on the upper layer of semiconductor material SGG2. The pitch $\Lambda$ of the grating is such that there is a resonance between the wavelength $\lambda$ of the wave to be detected in the material (if n is the optical index of the material and the wavelength $\lambda$o of the electromagnetic wave to be detected, in a vacuum with $\lambda=\lambda$o/n) and the grating, namely $\Lambda=\lambda$o/n.

According to a second variant of the invention, the detector of the invention is a photovoltaic detector, the detector zone constituted by small gap semiconductor materials is inserted between two layers of large-gap semiconductor materials with p type and n type doping. In this case, the electron-hole pairs created by the absorption of the energy photons from the electromagnetic wave are separated by the electrical field that prevails in the p-n junction. The holes and/or the electrons may be drained towards the ends and develop a potential difference proportional to the flux of photons detected, said potential difference being measured by electrical means located on either side of the stack of layers.

Advantageously, the detector of the invention may include two barrier layers of semiconductor materials with very large gaps $STG_1$ and $STG_2$ located at the interfaces of the layers of materials SGG1/SPG and SGG2/SPG to prevent said interfaces from behaving like ohmic contacts.

Advantageously, the coupling network is etched in the layer of semiconductor material SGG2.

Advantageously, the detector according to the invention may include a layer of semiconductor material SG contained between the substrate and the stack of layers of semiconductor materials SGG1/SPG/SGG2, the material SG having a refraction index that is smaller than that of the substrate S to confine the wave in the stack of layers.

BRIEF DESCRIPTION OF THE DRAWINGS

The invention will be understood more clearly and other advantages will appear from the following description, given on a non-restrictive basis with reference to the appended drawings, of which.

MORE DETAILED DESCRIPTION

Figure 3:
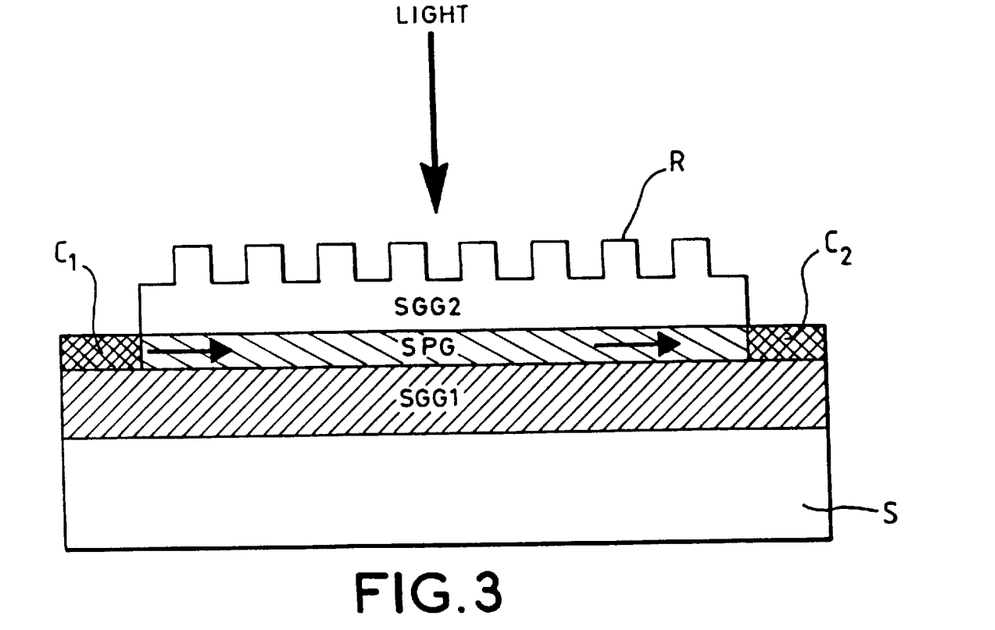
FIG. 3 illustrates a first exemplary photoconductor detector according to the invention.

According to one variant of the invention, the quantum structure detector working in the infrared range functions in photoconductor mode as shown in FIG. 3. A substrate S supports a stack of constituent layers of the detector. More specifically, this stack of layers comprises:

a layer of large-gap, non-doped semiconductor material $SGG_1$;

a layer of small-gap, non-doped semiconductor material SPG;

a layer of large-gap, non-doped semiconductor material $SGG_2$, whose surface has a grating R in raised relief to provide for efficient coupling between the electromagnetic wave to be detected and the detector zone constituted in the present case by the layer of material SPG.

Figure 6:
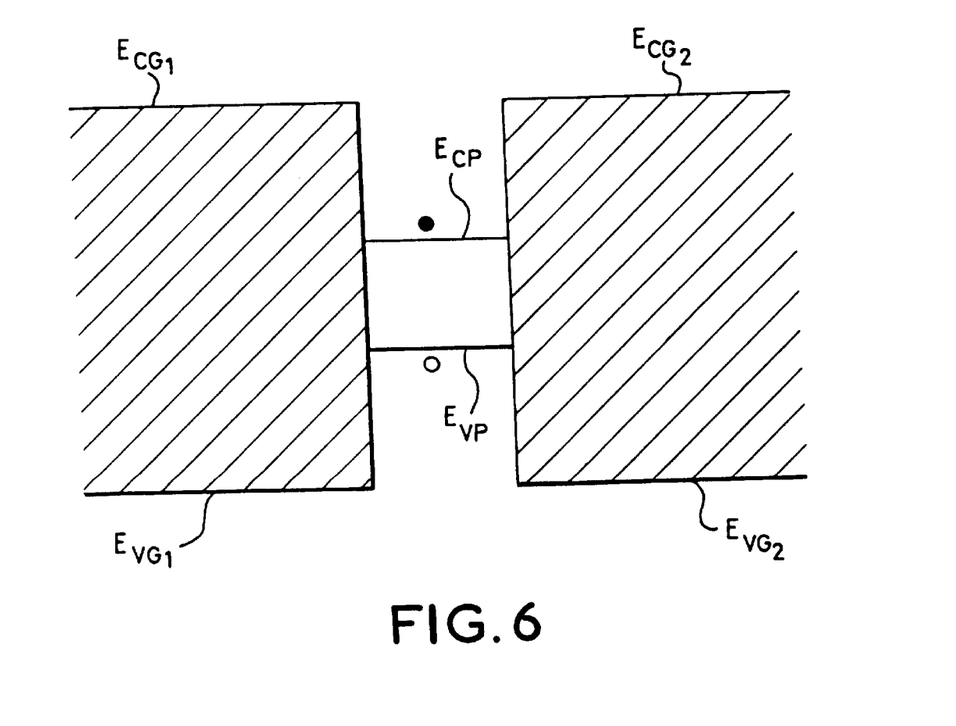
FIG. 6 gives a schematic view of the energy levels defining the valency bands and the conduction bands of the set of semiconductor materials used in an exemplary photoconductor detector according to the invention.

These electron-hole pairs remain confined in the detector zone as shown in FIG. 6 which shows an exemplary energy-level diagram of semiconductor materials SGG1, SPG and SGG2. The energy level $E_{VP}$ is higher than the energy levels $E_{VG1}$ and $E_{VG2}$ while the energy level $E_{CP}$ is lower than the energy level $E_{CG1}$ and $E_{CG2}$.

Ohmic contacts $C_1$ and $C_2$ are made at the detector zone in order to measure the variations in resistance of said detector zone at the appearance of the electron-hole pairs due to the incident photons.

Figure 4:
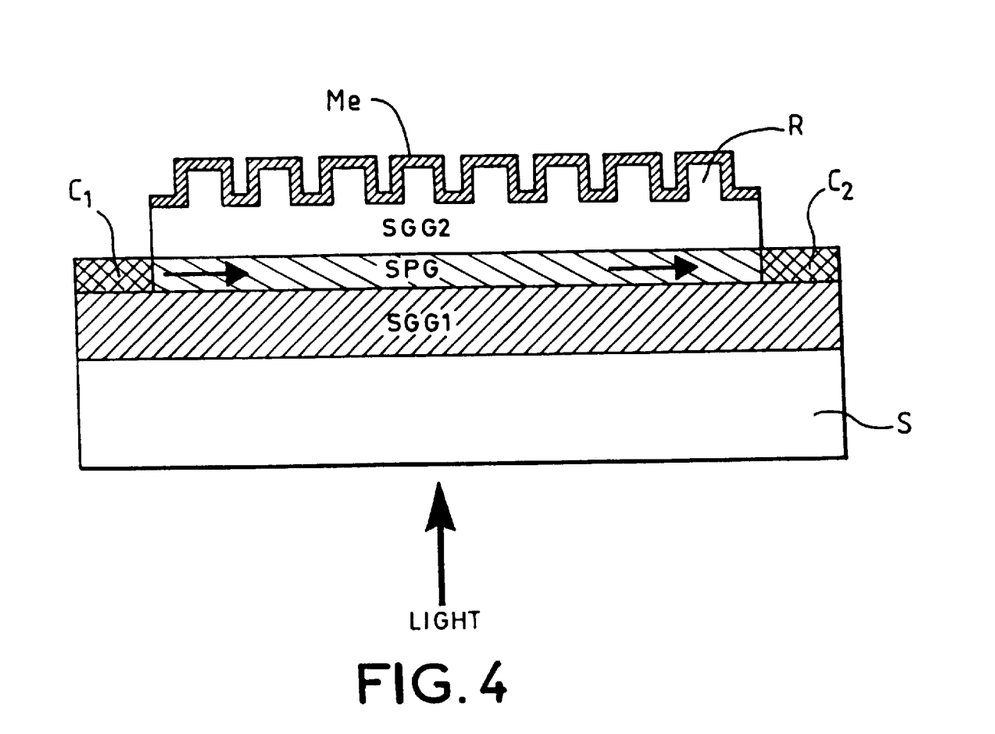
FIG. 4 illustrates a second exemplary photoconductor detector according to the invention.

FIG. 3 illustrates a detector in which the grating is transparent to incident light. FIG. 4 describes another variant of the invention in which the grating supports a metal layer Me, the light crossing the substrate.

Advantageously, this type of detector may include a guiding layer included in the SGG1 part to increase the interaction between the wave and the SGP part.

Figure 5:
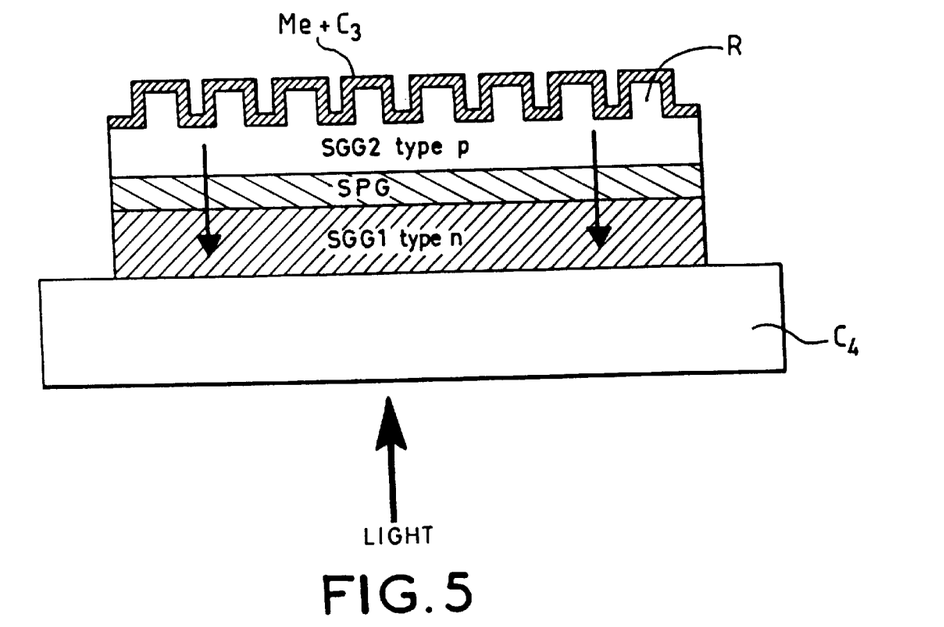
FIG. 5 illustrates a first exemplary photovoltaic detector according to the invention.

According to another variant of the invention, the detector works as a photovoltaic detector. As shown in FIG. 5, it may advantageously include:

a substrate constituted by a n-doped semiconductor material Sn;

a layer of large-gap semiconductor material with n-type doping, SGG1;

a layer of small-gap, non-doped semiconductor material SPGP;

a layer of large-gap, p-doped semiconductor material SGG1, whose surface has a grating in raised relief to provide for efficient coupling between the wave to be detected and the detector zone constituted by the layer of material SPG.

In this configuration, the movements of the free carriers take place perpendicularly to the plane of the layers and the ohmic contacts $C_3$ and $C_4$ are provided on either side of the stack of layers. The ohmic contact $C_3$ may be typically obtained by the metallization of the coupling grating and the setting up of a contact at the metallization (Me+CE).

To provide for the conveyance of the free carriers created in the stack of layers mentioned above, several alternatives may be envisaged.

Figure 7:
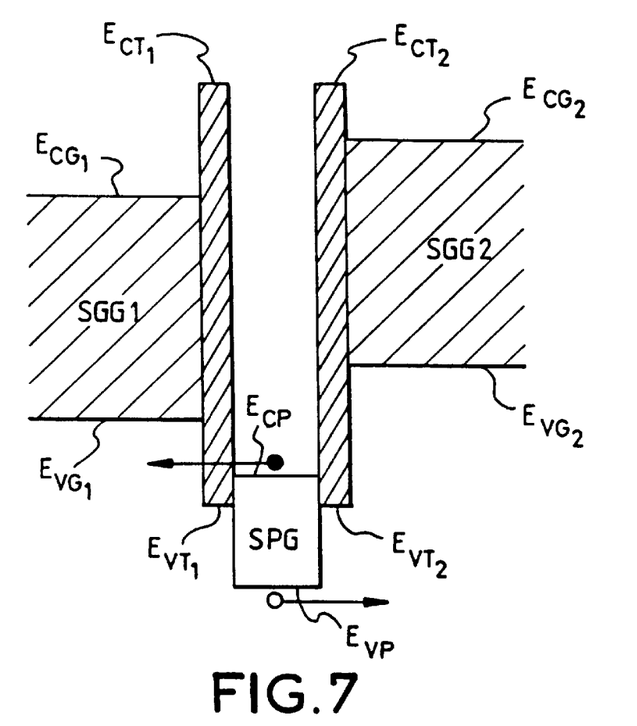
FIG. 7 gives a schematic view of the energy levels defining the valency bands and the conduction bands of the set of semiconductor materials used in an exemplary photovoltaic detector according to the invention, with a type III heterostructure.
Figure 11:
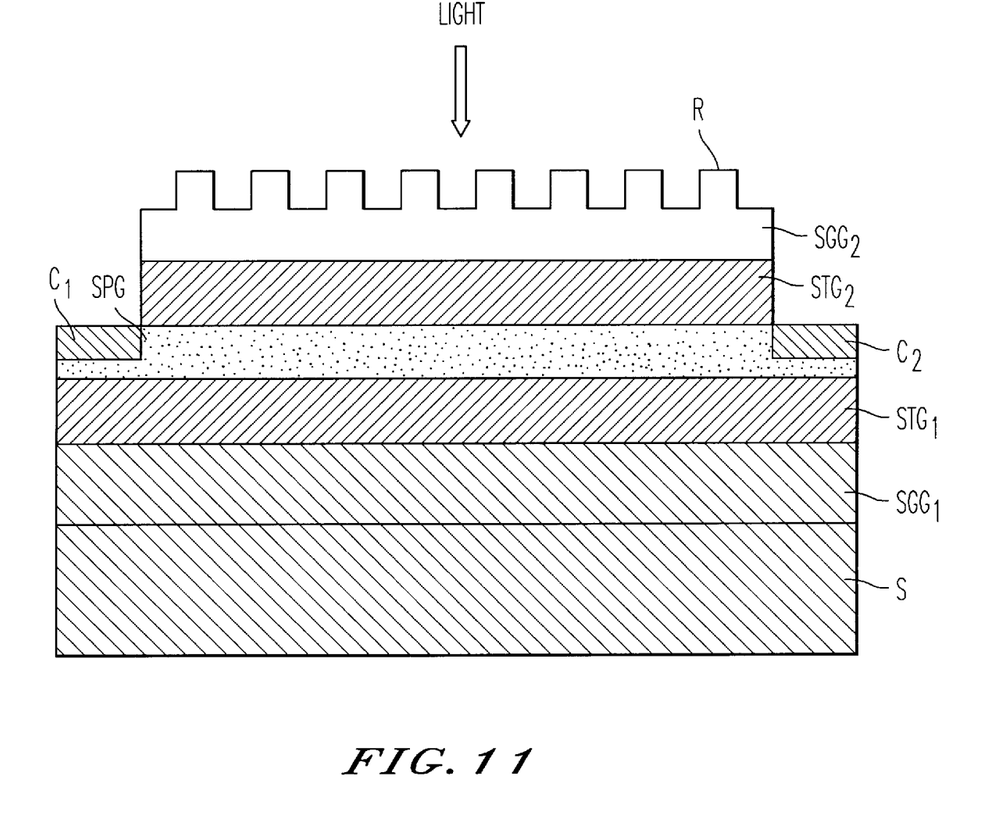
FIG. 11 illustrates another exemplary photoconductor detector according to the invention.

A first variant of a photoconductor detector uses a heterostructure known in the literature as a type III heterostructure (C. Weisbuch and B. Vinter, "Quantum semiconductor structures", Academic Press). As shown in FIG. 11, such a structure may include two barrier layers of semiconductor materials with very large gaps $STG_1$ and $STG_2$ located at the interfaces of the layers of material SGG1/SPG and SGG2/SPG to prevent the interfaces from behaving like ohmic contacts. In this structure, the bottom of the conduction band of the small-gap semiconductor is located at the top of the valency band of the large-gap semiconductors. FIG. 7 gives a schematic view of the gaps of the different semiconductor materials used in this type of heterostructure. The incident photons create electron-hole pairs on either side of the gap of the small-gap material SPG, this gap being defined by the maximum energy of the valency band $E_{VP}$ and the minimum energy of the conduction band $E_{CP}$. Two barrier layers constituted by materials having very large gaps must be interposed between the layers of materials $SGG_{1n}$/SPG and SPG/$SGG_{2P}$. The materials with very large gaps have gaps defined by the energy levels $E_{VT1}$ and $E_{CT1}$ on the one hand and $E_{VT2}$ and $E_{CT2}$ on the other hand. $E_{VT1}$ and $E_{VT2}$ are lower than $E_{CP}$, $E_{CT1}$ and $E_{CT2}$ may be higher than $E_{CG1}$ and $E_{CG2}$. In this configuration, the energy levels of the large-gap materials are such that the level $E_{VG1}$ is lower than the level $E_{VG2}$, the level $E_{CG1}$ being also lower than the level $E_{CG2}$ since the material $SGG_1$ is n-doped while the material $SGG_2$ is p-doped.

Figure 8:
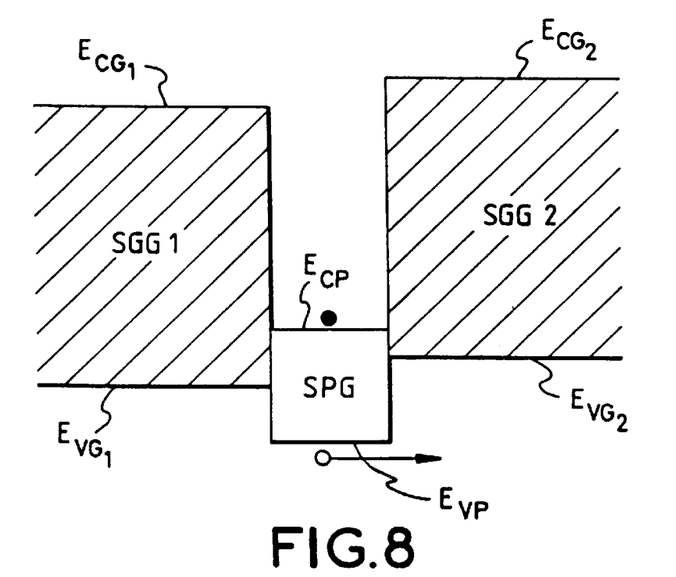
FIG. 8 gives a schematic view of the energy levels defining the valency bands and the conduction bands of the set of semiconductor materials used in an exemplary photovoltaic detector with a type II heterostructure.

Another variant of a photoconductor detector uses a type II heterostructure whose energy-level diagram is illustrated in FIG. 8. In this type of heterostructure, one of the types of carriers (the electrons in the example of FIG. 8) remains blocked within the small-gap material SGP and may give rise to an internal photovoltaic effect.

In the heterostructure of FIG. 8, the energy level $E_{CP}$ is higher than the two energy levels $E_{VG1}$ and $E_{VG2}$ and the electrons remain confined within the conduction band of the small-gap material SPG.

The holes may circulate towards the p-doped semiconductor material, the material $SGG_2$, and thus generate an internal photovoltaic effect.

Figure 9:
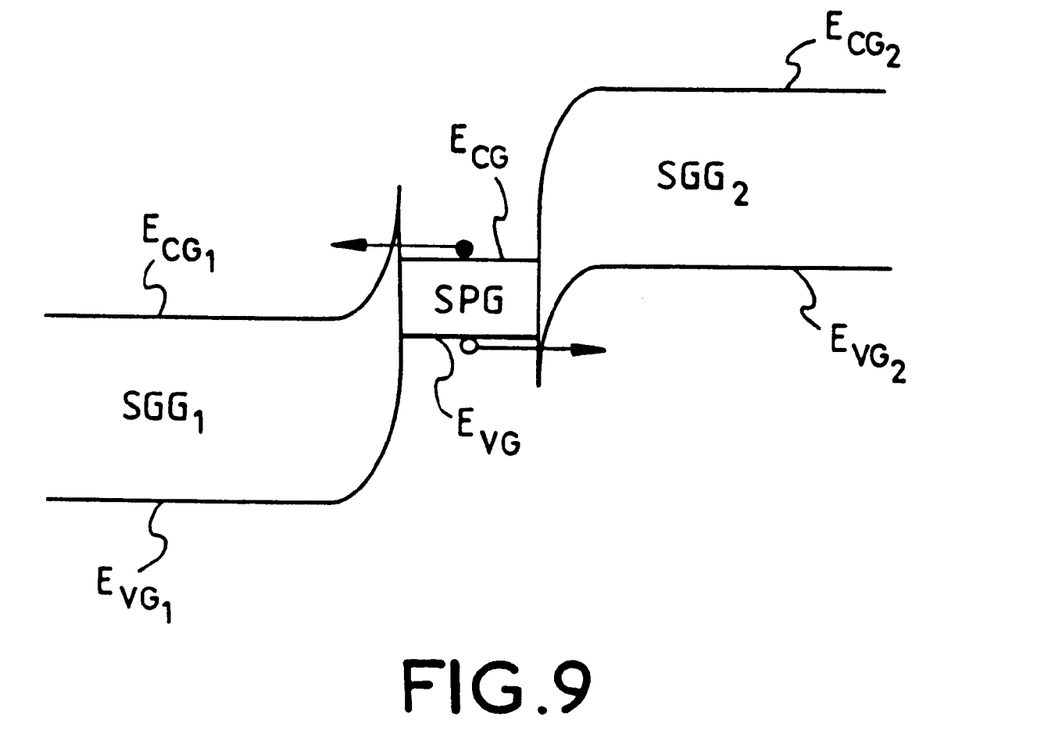
FIG. 9 gives a schematic view of the energy levels defining the valency bands and the conduction bands of the set of semiconductor materials used in an exemplary type I photovoltaic detector.

According to a third variant of a photoconductor detector, it is possible to use a type I heterostructure whose energy-level diagram is shown in FIG. 9. The large-gap semiconductor materials are very highly doped and the maximum energy levels of the valency bands are such that $E_{VG1} < E_{VG} < E_{VG2}$.

The minimum energy levels of the conduction bands are such that:

$$E_{CG1} < E_{CG} < E_{CG2}$$

The electron-hole pairs created may thus be emitted by tunnel effect through the doped zone.

Figure 10:
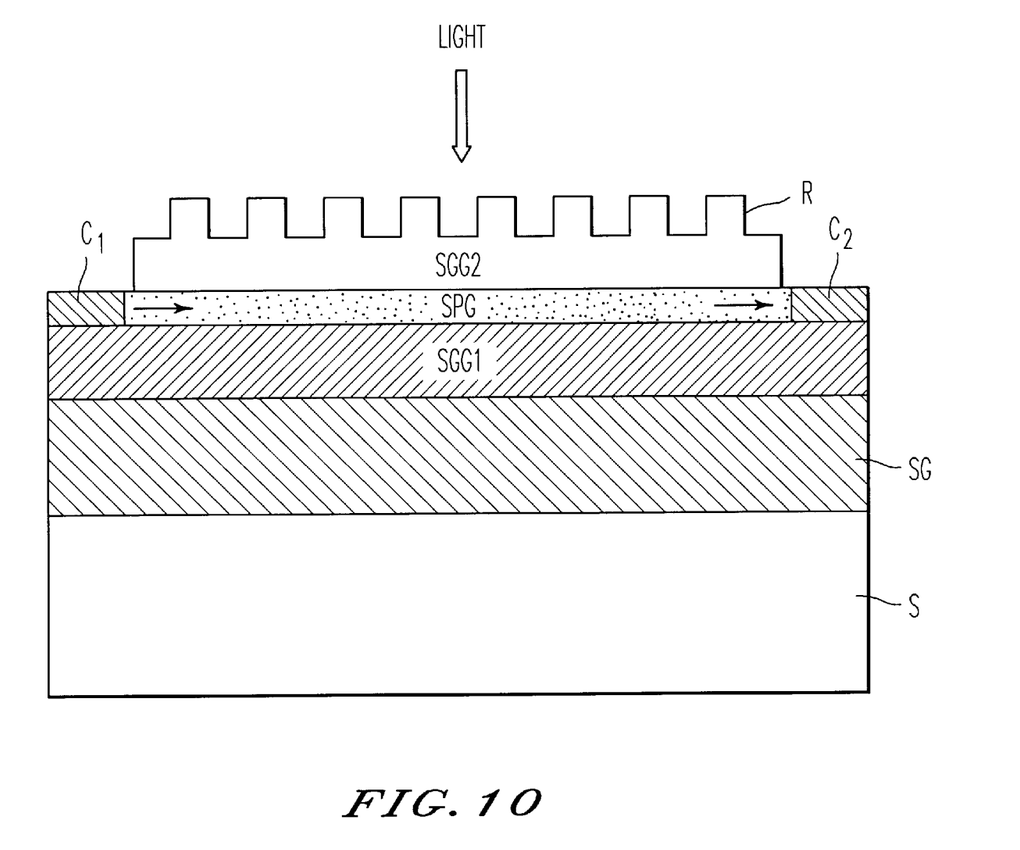
FIG. 10 illustrates a variation of an exemplary photoconductor detector according to the invention.

According to a further variant of the invention shown in FIG. 10, a layer of semiconductor material SG is included and contained between the substrate and the stack of layers of semiconductor materials SGG1/SPG/SGG2, the material SG having a refraction index that is smaller than that of the substrate S to confine the wave in the stack of layers.

In general, all the constituent layers of the detectors according to the invention may be obtained by any technique known to those skilled in the art. However, in order to eliminate the electrical effects which are sources of noise, the $SGG_1$/SPG/$SGG_2$ structure should be crystallized and therefore obtained by molecular beam epitaxy or by vapor phase deposition. The semiconductor systems possible are for example GaAlSb/InAsSb/GaAlSb, CdTe/HgCdTe/CdTe, PbS/PbSnSe/PbS, etc.

Exemplary Embodiment of a Photoconductor Detector

The semiconductor materials are the following:

$SGG_1$: GaSb

SPG: InAsSb $SGG_2$: AlSb

The stacking of the layers is done with a lattice matching, i.e. in conditions where the distances between atoms are almost equal in all the materials. The following epitaxy is obtained:

Starting from a GaSb substrate, a GaSb layer of the order of 0.2 μm is epitaxially grown.

On this layer of material $SGG_1$, a 100 Å layer of $AlAs_{0.08}Sb_{0.92}$ is made with a lattice matching with the GaSb layer, and forms a barrier for the electrons created in InAsSb. Then, a detector layer of $InAs_{0.85}Sb_{0.15}$ is created with a thickness of 0.1 μm then again a 100 Å layer of $AlAs_{0.08}Sb_{0.92}$ and finally a 0.6 μm layer of GaSb.

The composition of the InAsSb layer is chosen to obtain a cutoff wavelength (namely $InAs_{0.85}Sb_{0.15}$) of 5.1 μm.

A grating is etched to obtain a resonance of about 5 μm, i.e. for a grating period of 1.52 μm. The depth of the grating is 0.3 μm.

With these conditions, the maximum quantum yield is 80% despite a very small thickness of 0.1 μm for the detector zone.

Without a coupling grating, a 1 μm layer is needed to obtain an identical quantum yield leading to noise equivalent temperature NETD of 150 mK. By lowering the thickness of the detector layer to 0.1 μm, the detectivity is increased by a factor of 3 leading to an NETD of 50 mK.

Exemplary Embodiment of a Photovoltaic Detector

The photovoltaic detector is defined on a substrate of GaSb with n-type doping.

A 1 μm layer of GaSb with n-type doping is epitaxially grown on this substrate. Then a layer of about 50 Å $AlAs_{0.08}Sb_{0.92}$ is used to prevent the InAsSb/GaSn heterostructure from behaving like an ohmic contact. A detector layer of $InAs_{0.085}Sb_{0.15}$ with a thickness of 0.1 μm is epitaxially grown, followed by a 50 Å layer of $AlAs_{0.08}Sb_{0.92}$ and a 1 μm layer of GaSb with p-type doping. This heterostructure is a type III heterostructure and enables the electrons and holes to be emitted out of the detector zone. A grating identical to that of the example of the photoconductor detector described here above is etched on the GaSb layer with p-type doping. Then a layer of metal (for example gold) is vapor-deposited on the grating as an electrical contact layer. The improvement of the performance characteristics of this photovoltaic detector with respect to the prior art photovoltaic detector is the same as that mentioned in the case of photoconductor detectors.

What is claimed is:

1. An optical wave guide detector with quantum structure comprising a stack of layers of semiconductor materials on a substrate with an electromagnetic wave detection zone, wherein the stack of layers comprises a layer of semiconductor material with low gap energy having a thickness of about 1000 Å constituting a detection zone, contained between first and second layers of a semiconductor material with high gap energy, and wherein the detector comprises a coupling grating on the stack of layers to obtain efficient coupling between the optical wave to be detected and the detector zone.

2. A detector with quantum structure according to claim 1, wherein said first and second layers of semiconducting material with high gap energy are insulating, and wherein said structure further comprises means to measure variations in resistivity of the layer of semiconductor material with low gap energy.

3. A detector with quantum structure according to claim 1, wherein said first layer of semiconductor material has n type doping and said second layer of semiconductor material has p type doping, and wherein said structure further comprises voltage measurement means located on either side of the stack of layers.

4. A detector with quantum well structure according to claim 1, comprising first and second barrier layers of semiconductor material with very large gap energy wherein said first barrier layer is located at the interface of said first layer of semiconductor material with high gap energy and said detection zone and said second barrier layer is located at the interface of said second layer of semiconductor material and said detection zone.

5. A detector with quantum structure according to claim 1, wherein the coupling grating is etched in the second layer of semiconductor material.

6. A detector with quantum structure according to claim 1, comprising a layer of semiconductor material having a small refraction index contained between the substrate and the stack of layers of semiconductor materials comprising said first layer of semiconductor material with high gap energy/ said detection zone/said second layer of semiconductor material, the layer of semiconductor material having a small refraction index having a refraction index that is smaller than that of the substrate to confine the optical wave in the stack of layers.

7. A detector with quantum structure according to claim 1, wherein the stack of semiconductor materials is of the GaAlSb/InAsSb/GaAlSb type or CdTe/HgCdTe/CdTe type or PbS/PbSnSe/PbS type.

* * * * *